United States Patent
McMasters et al.

(10) Patent No.: US 10,683,807 B2
(45) Date of Patent: Jun. 16, 2020

(54) ANTI-COKING COATINGS, PROCESSES THEREFOR, AND HYDROCARBON FLUID PASSAGES PROVIDED THEREWITH

(71) Applicant: General Electric Company, Schenectady, NY (US)

(72) Inventors: Marie Ann McMasters, West Chester, OH (US); Wayne Charles Hasz, Niskayuna, NY (US); Charles C. Zhang, West Chester, OH (US)

(73) Assignee: General Electric Company, Schenectady, NY (US)

( * ) Notice: Subject to any disclaimer, the term of this patent is extended or adjusted under 35 U.S.C. 154(b) by 555 days.

(21) Appl. No.: 15/118,666

(22) PCT Filed: Feb. 13, 2015

(86) PCT No.: PCT/US2015/015801
§ 371 (c)(1),
(2) Date: Aug. 12, 2016

(87) PCT Pub. No.: WO2015/123513
PCT Pub. Date: Aug. 20, 2015

(65) Prior Publication Data
US 2017/0051675 A1    Feb. 23, 2017

Related U.S. Application Data

(60) Provisional application No. 61/939,316, filed on Feb. 13, 2014.

(51) Int. Cl.
*F02C 7/22* (2006.01)
*B22F 3/105* (2006.01)
(Continued)

(52) U.S. Cl.
CPC .............. *F02C 7/22* (2013.01); *B22F 3/1055* (2013.01); *B22F 3/24* (2013.01); *B22F 5/009* (2013.01);
(Continued)

(58) Field of Classification Search
CPC ... F02C 7/22; F02C 7/06; B33Y 10/00; B33Y 40/00; B33Y 80/00; B23K 26/342;
(Continued)

(56) References Cited

U.S. PATENT DOCUMENTS 5,547,706 A    8/1996 Ackerman
5,805,973 A    9/1998 Coffinberry et al.
(Continued)

FOREIGN PATENT DOCUMENTS

| DE | 19953459 | 5/2001 |
|---|---|---|
| JP | 2006056976 | 3/2006 |
| WO | 2015123513 A1 | 8/2015 |

OTHER PUBLICATIONS

International Search Report and Written Opinion issued in connection with corresponding Application No. PCT/US2015/015801 dated Apr. 29, 2015.
(Continued)

*Primary Examiner* — Mark A Laurenzi
*Assistant Examiner* — Loren C Edwards
(74) *Attorney, Agent, or Firm* — Dority & Manning, P.A.

(57) ABSTRACT

A method for providing an anti-coking coating system on a surface at elevated temperatures when contacted by a hydrocarbon fluid, for example, a surface of an interior fuel passage within a fuel nozzle of a type utilized in gas turbine engines, is disclosed. The surface of the passage is rough as a result of the passage being part of a component manufactured by an additive manufacturing (AM) process. In addition, the passage may have a complex geometry of a type
(Continued)

that can be fabricated with AM processes, for example, geometries comprising combinations of sharp bends and narrow cross-sections. The coating system comprises at least one ceramic barrier layer and an outermost metallic layer, each of which is formed using a conformal vapor deposition process.

16 Claims, 2 Drawing Sheets

(51) Int. Cl.
| | |
|---|---|
| C23C 16/40 | (2006.01) |
| B22F 5/10 | (2006.01) |
| C23C 28/00 | (2006.01) |
| C23C 16/18 | (2006.01) |
| B33Y 10/00 | (2015.01) |
| B33Y 40/00 | (2020.01) |
| B33Y 80/00 | (2015.01) |
| B23K 26/342 | (2014.01) |
| B22F 3/24 | (2006.01) |
| B22F 5/00 | (2006.01) |
| B22F 7/04 | (2006.01) |
| B23K 15/00 | (2006.01) |
| C23C 16/44 | (2006.01) |
| F02C 7/06 | (2006.01) |

(52) U.S. Cl.
CPC ............... *B22F 5/10* (2013.01); *B22F 7/04* (2013.01); *B23K 15/0086* (2013.01); *B23K 26/342* (2015.10); *B33Y 10/00* (2014.12); *B33Y 40/00* (2014.12); *B33Y 80/00* (2014.12); *C23C 16/18* (2013.01); *C23C 16/40* (2013.01); *C23C 16/44* (2013.01); *C23C 28/32* (2013.01); *C23C 28/3455* (2013.01); *F02C 7/06* (2013.01); *B22F 2003/242* (2013.01); *B22F 2007/042* (2013.01); *B22F 2998/10* (2013.01); *F05D 2220/32* (2013.01); *F05D 2230/314* (2013.01); *F05D 2300/171* (2013.01); *F05D 2300/177* (2013.01); *Y02P 10/295* (2015.11); *Y02T 50/6765* (2018.05)

(58) Field of Classification Search
CPC ...... B23K 15/0086; B22F 3/1055; B22F 3/24; B22F 5/009; B22F 5/10; B22F 7/04; B22F 2007/042; B22F 2003/242; B22F 2998/10; C23C 16/18; C23C 16/40; C23C 16/44; C23C 28/32; C23C 28/34; C23C 28/3455; Y02P 10/295; F05D 2220/32; F05D 2230/314; F05D 2300/171; F05D 2300/177
USPC .......................................................... 60/734
See application file for complete search history.

(56) References Cited

U.S. PATENT DOCUMENTS

| | | | |
|---|---|---|---|
| 5,891,584 A | 4/1999 | Coffinberry | |
| 5,923,944 A | 7/1999 | Coffinberry et al. | |
| 6,156,439 A | 12/2000 | Coffinberry | |
| 6,354,072 B1 | 3/2002 | Hura | |
| 6,363,726 B1 | 4/2002 | Durbin et al. | |
| 6,367,262 B1 | 4/2002 | Mongia et al. | |
| 6,381,964 B1 | 5/2002 | Pritchard et al. | |
| 6,389,815 B1 | 5/2002 | Hura et al. | |
| 6,418,726 B1 | 7/2002 | Foust et al. | |
| 6,453,660 B1 | 9/2002 | Johnson et al. | |
| 6,484,489 B1 | 11/2002 | Foust et al. | |
| 6,808,616 B2 | 10/2004 | Sanchez-Cano | |
| 6,808,816 B2 | 10/2004 | Mancini et al. | |
| 6,865,889 B2 | 3/2005 | Mancini et al. | |
| 7,311,979 B2 | 12/2007 | Mancini et al. | |
| 2004/0053024 A1 | 3/2004 | Mancini et al. | |
| 2006/0056976 A1* | 3/2006 | Dye | C23C 16/06 416/241 R |
| 2006/0249332 A1 | 11/2006 | Bruce | |
| 2009/0255256 A1* | 10/2009 | McMasters | B22F 3/1055 60/734 |
| 2009/0255257 A1 | 10/2009 | McMasters et al. | |
| 2010/0263382 A1 | 10/2010 | Mancini et al. | |
| 2012/0003086 A1 | 1/2012 | Morris et al. | |

OTHER PUBLICATIONS

Canadian Office Action Corresponding to Application No. 2938876 dated Nov. 1, 2017.
Chinese Office Action Corresponding to Application No. 201580008527.1 dated Nov. 16, 2017.
Chinese Office Action Corresponding to Application No. 201580008527.1 dated Mar. 6, 2018.
Canadian Office Action Corresponding to Application No. 2938876 dated Jun. 11, 2018.
Japanese Office Action Corresponding to Application No. 2016550215 dated Dec. 18, 2018.
Indian Office Action Corresponding to Application No. 201647027740 dated Mar. 29, 2019.
European Office Action Corresponding to Application No. 15707469.1 dated Jun. 17, 2019.

* cited by examiner

ANTI-COKING COATINGS, PROCESSES THEREFOR, AND HYDROCARBON FLUID PASSAGES PROVIDED THEREWITH

BACKGROUND

Embodiments of the present invention relate to coatings intended to inhibit the formation and coating systems for preventing or reducing the deposition of carbonaceous deposits on surfaces that are at elevated temperatures when contacted by hydrocarbon fluids, including rough and complex fluid passage surfaces contacted by fuels and oils.

Aircraft gas turbine engines function by receiving air through an intake, compressing the air, mixing fuel into the compressed air, combusting the fuel in the fuel/air mixture, and using the resulting hot combustion gases to propel an aircraft. Staged combustion systems have been developed for use in aircraft gas turbine engines to limit the production of undesirable combustion product components such as oxides of nitrogen (NOx), unburned hydrocarbons (HC), and carbon monoxide (CO), particularly in the vicinity of airports, where they contribute to urban photochemical smog problems. Also, gas turbine engines are designed to achieve better fuel efficiency and lower operational costs, while simultaneously maintaining or even increasing engine output. Consequently, important design criteria for aircraft gas turbine engine combustion systems include provisions for high combustion temperatures to provide high thermal efficiency under a variety of engine operating conditions and to minimize undesirable combustion conditions that can contribute to the emission of particulates, undesirable gases, and combustion products that can be precursors to the formation of photochemical smog.

The injection of fuel into the compressed air to form a fuel/air mixture in the combustion chamber is an important aspect of engine operation because the composition of the fuel/air mixture and the method of injection can have large impacts on overall engine performance. Fuel injector designs generally entail some type of fuel nozzle for injecting fuel into the combustion chamber. Fuel nozzle designs may include main and pilot nozzles, and they may include axially, radially, and circumferentially extending fuel passages that supply fuel to the main and pilot nozzles. Portions of these fuel passages may be very small and complicated with geometries such as sharp bends or spirals.

The construction and fabrication of a fuel nozzle can significantly impact the method of fuel injection. As such, improved fuel nozzles and methods for their fabrication are constantly being sought. One such method is additive manufacturing (AM). As used herein, AM refers to processes that entail fusing powders to form a solid three-dimensional net or near-net-shape (NNS) object by sequentially forming the object one layer at a time. AM processes may include, but are not limited to, three-dimensional printing (3DP) processes, laser-net-shape manufacturing (LNSM), direct metal laser melting (DMLM), and electron beam sintering. Some AM processes use energy beams, for example, electron beams or electromagnetic radiation such as laser beams, to sinter or melt a powder material. An object is built up layer by layer in a linear build direction, with each layer being substantially perpendicular to the build direction. AM processes can integrate computer-aided design (CAD) models to produce objects having complex geometries.

AM processes may be beneficial for the production of fuel nozzles, as they allow novel and complex nozzle designs to be produced and tested relatively quickly. However, components produced by AM processes tend to have rough surfaces, which in the case of fuel nozzles, includes internal passages through which fuel will flow. In some instances, the range of interior surface roughnesses of fuel passages produced by AM processes can be up to about 1200 micro-inches (about 30 micrometers) Ra or greater, for example, about 300 to about 1200 micro-inches (about 8 to 30 micrometers) Ra (the roughness parameter defined by the arithmetic average of the absolute values of the vertical deviations on the surface). Consequently, complex designs and rough interior surfaces of fuel nozzles produced in this manner present their own challenges.

Coke deposition is a common issue in aircraft fuel and lubrication systems exposed to high temperatures. Coke deposition can be caused by the catalytic-thermal degradation of hydrocarbon fluids, resulting in carbon becoming attached and building up as deposits on surfaces contacted by a fuel or oil. Carbon deposits may develop if the fluid circuit is operated at reduced flow rates or closed without the remaining stagnant fuel being purged. As the deposits collect, they can become sufficiently large to reduce or even obstruct fluid flow. In the case of a fuel circuit, such carbon deposition can lead to degraded engine performance, reduced heat transfer efficiencies, increased pressure drops, and increased rates of material corrosion and erosion, all of which can necessitate the use of expensive de-coking procedures.

Suitable countermeasures to coke build-up may include the application of a coating, sometimes referred to as a coke barrier coating (CBC) or an anti-coking coating system, to the interior surfaces of a component such as a fuel nozzle or other surface that will be at elevated temperatures when contacted by a hydrocarbon fluid. Examples of anti-coking coating systems include an inner layer, which may be a ceramic material, applied to the surface of a fluid passage, over which an outer layer, which may be platinum, is deposited that will be contacted by the fluid. The inner layer may serve as a diffusion barrier layer that separates the outer layer from the surface on which the coating system is deposited. The outer layer hinders carbon deposits from sticking to the surfaces of the fluid passage, and in some forms may serve as a catalyst to form nonadherent particles, thereby reducing coking and deposit buildup. With the coating system in place, small flakes of coke quickly spall from the passage walls with little risk of blocking small orifices or metering passages that may exist downstream. In an embodiment, the coating system is continuous and completely covers all surfaces of a component that would otherwise contact the hydrocarbon fluid. Such coating systems may further contain additional layers as long as the hydrocarbon fluid will contact the outer layer, which, in certain embodiments, may comprise or consist of platinum at the outermost surface of the coating system.

In an embodiment, to minimize the temperature of the hydrocarbon fluid and, therefore, the tendency for the fluid to form carbonaceous deposits, the outermost layer exhibits low emissivity. Such low emissivity minimizes radiation heat transfer to the fluid. For this purpose, in an embodiment, a surface roughness for the outermost layer may be about 40 micro-inches (about 1.0 micrometer) Ra or less. The inner and outermost layers of anti-coking coating systems may be applied using chemical vapor deposition (CVD) techniques, in which vapors containing one or more suitable chemical precursors may be deposited on the intended surface, where the precursors may be reacted or decomposed to form one of the desired layer materials. Because CVD processes are capable of depositing conformal layers so that the surface finish of the coating system nearly replicates that of the underlying surface, to attain a surface finish typically desired for the outermost layer of an anti-coking coating system, i.e., about 1.0 micrometer Ra or less, conventional wisdom would suggest that the surface to be coated may need to undergo a treatment to improve its surface finish, followed by deposition of the coating system whose final surface finish may be and often is only slightly better than that of the underlying surface.

While anti-coking coating systems deposited by CVD have proven effective for certain engine components, including lubricant and scavenge lines, such components have predominantly straight or only slightly curved passages and smooth interior surfaces. There exists a need for similar anti-coking systems that may be applied to fluid passages of components having complex shapes and rough interior surfaces, nonlimiting examples of which include components produced by AM processes.

BRIEF DESCRIPTION

Embodiments of the present invention provide coating systems and methods capable of reducing the tendency for hydrocarbon fluids to form carbonaceous deposits at elevated temperatures that tend to adhere to interior surfaces of a fluid passage or other fluid containment surface.

According to one aspect of the invention, a method is provided that produces a component having an internal passage with an interior surface thereof configured and adapted to contact a hydrocarbon fluid. The method includes producing the component, the internal passage thereof, and the interior surface thereof using an additive manufacturing process, and performing a vapor deposition process that comprises flowing a first precursor through the internal passage to deposit a conformal interior layer directly on the interior surface and flowing a second precursor through the internal passage to deposit a conformal outermost layer overlying the interior layer. The interior layer and the outermost layer define a conformal anti-coking coating system on the interior surface and the outermost layer defines an outermost surface of the anti-coking coating system.

According to another aspect of the invention, a component is provided that is produced by an additive manufacturing process to have an internal passage with an interior surface thereof configured and adapted to contact a hydrocarbon fluid. The component includes a conformal interior layer directly on the interior surface, and a conformal outermost layer overlying the interior layer. The interior layer and the outermost layer define a conformal anti-coking coating system on the interior surface and the outermost layer defines an outermost surface of the anti-coking coating system. In certain embodiments, the component may be a fuel nozzle, and the hydrocarbon fluid may be a fuel.

A technical effect of an embodiment of the invention is the ability to produce an effective anti-coking coating system on a surface produced by an additive manufacturing (AM) process, particularly on internal surfaces produced thereby that were previously believed to be excessively rough and potentially too complex to accept and form an effective anti-coking coating system.

Other aspects and advantages of embodiments of the invention will be better appreciated from the following detailed description.

DETAILED DESCRIPTION OF THE INVENTION

Embodiments of the present invention relate to anti-coking coating systems and coating methods capable of reducing the tendency for hydrocarbon fluids, including such nonlimiting examples as fuels and oils, to form carbonaceous deposits that adhere to interior surfaces of a fluid passage or other containment surface. Such surfaces may include passages within fuel nozzles, fuel/air heat exchangers, oil sumps and other fuel and hydraulic system components of gas turbine engines. Embodiments of the invention may find particular use with fluid passages having complex geometries and very rough surfaces, for example, interior fuel passages of gas turbine engine fuel nozzles produced by AM processes. An embodiment may utilize conformal vapor deposition processes, a nonlimiting example being a metallo-organic (organometallic) chemical vapor deposition (MO-CVD) process, to push or pump one or more vapors containing precursors of the desired coating system through a fluid passage.

Figure 1:
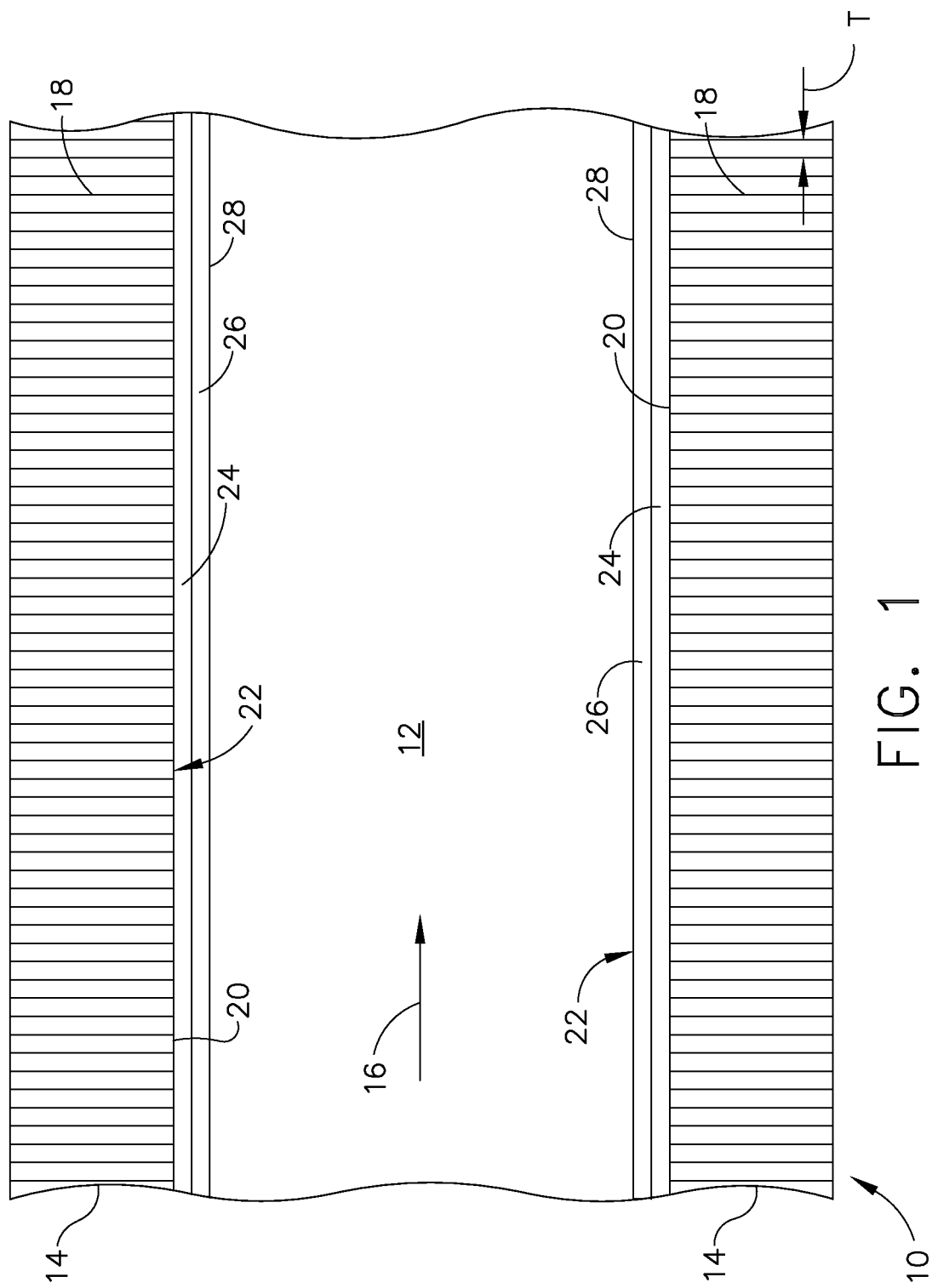
FIG. 1 is a schematic representation of a fuel passage interior surface coated with an anti-coking coating system.

As a nonlimiting example, FIG. 1 schematically represents a fluid passage 12 within a component 10 produced by an AM process as previously described. The component 10 may be, as nonlimiting examples, a fuel nozzle, fuel/air heat exchanger, oil sump, or other fuel or hydraulic system component of a gas turbine engine. The composition of the metallic powder may be chosen to provide mechanical and chemical properties desired for the component 10 and its passage 12 relative to its exterior operating environment and the fuel that flows through its passage 12. Typical materials include stainless steels, corrosion-resistant alloys of nickel and chromium, and high-strength nickel-base alloys.

The limited portion of the passage 12 represented in FIG. 1 may be an axially, radially, or circumferentially-extending portion of the passage 12. In the nonlimiting example of a fuel nozzle or other fuel system component of a gas turbine engine, such portion may supply fuel to main and pilot nozzles. The walls 14 of the passage 12 are schematically represented as having been built up layer by layer in a linear build direction 16, with each individual layer 18 being disposed in a plane oriented substantially perpendicular to the build direction 16. As previously discussed, such an AM process is capable of integrating computer-aided design (CAD) models to produce the component 10 to have a complex, nonlinear geometry, including sharp, multi-turn, helical, and/or annular bends, curves, loops, spirals, etc., (not shown) within the fluid passage 12. As nonlimiting examples, passage bend radii of less than one inch (about 25 mm), and in some instances 0.1 inch (about 2.5 mm) and less, are contemplated. In addition, the passage 12 may be fabricated to have any cross-sectional shape (e.g., round or rectangular) and have relatively narrow passage widths, for example, a cross-sectional dimension of about 0.1 inch (about 2.5 mm) or less. However, a consequence of the AM process is that the interior surfaces 20 of the walls 14 can be very rough, for example, on the order of 8 to 30 micrometers Ra and even higher, from the layer-by-layer buildup process in which individual layers 18 having discrete thicknesses of, as a nonlimiting example, about 50 to 250 micrometers, are oriented substantially perpendicular to the interior surfaces 20 of the passage 12.

Due in part to its composition, the surfaces 20 of the component passage 12 may be prone to catalyzing coke deposition when wetted by a hydrocarbon fluid in the high temperature environment of a gas turbine engine. Conventional wisdom suggests that the surface roughness of the passage 12 may also promote coke deposition. FIG. 1 further represents an anti-coking coating system 22 on the rough interior surfaces 20 of the fluid passage 12. The coating system 22 is represented in FIG. 1 as having an interior layer 24 deposited directly on the interior surfaces 20, and an outermost layer 26 that overlies and contacts the interior layer 24 to form an outermost surface 28 of the coating system 22 that will contact a fluid flowing through the passage 12. The coating system 22 may further include additional layers as long as the hydrocarbon fluid will contact the outermost layer 26 as the outermost surface 28 of the coating system 22. In certain embodiments, the coating system 22 is continuous and completely covers portions of the interior surfaces 20 of the walls 14 that would otherwise contact the hydrocarbon fluid flowing through the passage 12. According to certain embodiments, the interior layer 24 is a ceramic barrier layer, which may be made of materials that include, for example, silica ($SiO_2$), alumina ($Al_2O_3$), tantala ($Ta_2O_5$), hafnia ($HfO_2$), yttria ($Y_2O_3$), or chemical combinations of silica with boron and/or phosphorous and/or alumina, and in some embodiments may consist entirely of one or more of these ceramic materials. According to other embodiments, the outermost layer 26 may include platinum and in some embodiments may consist entirely of platinum or consist of platinum at the outermost surface 28. However, these compositions of the layers 24 and 26 may vary by application and design, and the composition of the coating system 22 is not intrinsic to embodiments of the invention.

Each layer 24 and 26 can be deposited by a vapor deposition process that entails pumping an appropriate precursor-containing vapor through the passage 12, as will be described below in further detail. Each layer 24 and 26 may be deposited in one or more passes. In combination, the interior layer 24 and the outermost layer 26 may provide the anti-coking coating system 22 with the capability of preventing or at least hindering the deposition and/or adhesion of carbon (coke) on the fluid-contacting outermost surface 28 when at an elevated temperature and wetted with a hydrocarbon fluid, such as fuel or oil. However, contrary to prior practices used with anti-coking coatings, the layers 24 and 26 of the coating system 22 are not deposited on a smooth underlying surface, for example, having a surface roughness of about 1.0 micrometer Ra or less, or to replicate or otherwise achieve such a smooth surface at the outermost surface 28 of the coating system 22. Instead, the layers 24 and 26 of the coating system 22 can be deposited on the relatively rough underlying surfaces 20 of the passage 12 produced by an AM process, for example, having surface roughnesses of about 250 micro-inches (about 6.4 micrometers) Ra or more, and potentially as high as about 750 micro-inches (about 19 micrometers) Ra or more, and are substantially conformal so as to replicate or otherwise achieve a similarly rough surface at the outermost surface 28 of the coating system 22. Though embodiments of the present invention are capable of coating rough surfaces using a coating process that generally deposits a relatively conformal coating, it is foreseeable that the coating process may result in the outermost layer 26 having a surface roughness slightly smoother than the underlying passage surfaces 20, in which case the above-noted surface roughness can be achieved for the outermost layer 26, though the surface roughness of the underlying passage surfaces 20 may be greater than 250 micro-inches (about 6.4 micrometers) Ra and potentially greater than 750 micro-inches (about 19 micrometers) Ra.

The potential complexity (nonlinearity) and small cross-sections of the passage 12 contribute to the difficulty of applying the layers 24 and 26 to the interior surfaces 20 of the passage 12, particularly in designs that comprise axially, radially, and/or circumferentially-extending fluid passages that may carry fuel or oil within a fuel or hydraulic system of a gas turbine engine, for example, a passage that supplies fuel to main and pilot nozzles of a fuel injector. As noted previously, the interior layer 24 and the outermost layer 26 of the coating system 22 may be applied to the fuel passage surfaces 20 by pumping appropriate vapors containing precursors of the desired coating materials through the passage 12. As a nonlimiting example, fuel injectors may be conventionally configured to include one or more inlets through which fuel is supplied to the injector and one or more nozzle tips through which the fuel is injected into the combustor, and the vapors may be pumped through one or more fuel inlets of the component 10 and exit the component 10 through one or more nozzle tips. A nonlimiting example of a suitable precursor for the interior layer 24 is tantalum (V) ethoxide ($Ta(OC_2H_5)_5$) as a chemical precursor for tantala. A nonlimiting example of a suitable precursor for the outermost layer 26 is platinum (II) 2,4-pentanedionate (Pt$(C_5H_7O_2)_2$ as a chemical precursor for platinum.

The vapor for depositing the interior layer 24 may be pumped through the passage 12 any number of times necessary to deposit the interior layer 24 to a desired thickness, after which the process can be repeated with the vapor for depositing the outermost layer 26. Suitable thicknesses for the interior layer 24 are generally on the order of about 1 to about 2 micrometers. Suitable thicknesses for the outermost layer 26 are generally on the order of about 0.03 to about 0.1 micrometer. At such thicknesses, the interior layer 24 has a greater impact of the surface roughness of the outermost surface 28 of the coating system 22 than would the outermost layer 26. In an embodiment, the coating system 22 is applied following any braze operations performed on the component 10 and prior to the installation of other parts within the component 10.

Figure 2:
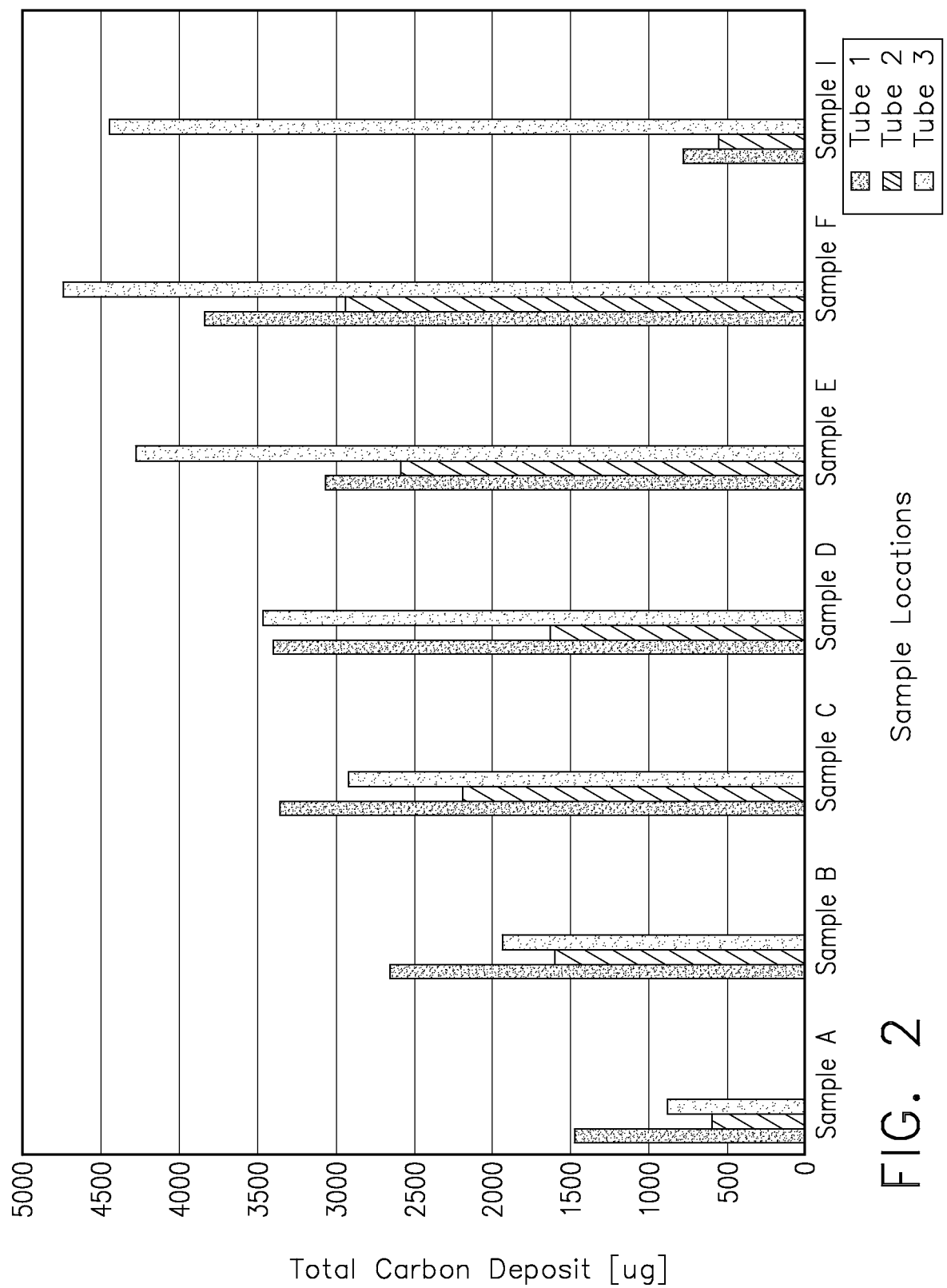
FIG. 2 is a bar graph comparing results of coking tests performed on coated and uncoated test specimens, including a specimen provided with an anti-coking coating system within the scope of the present application.

In investigations leading to the present application, it was determined that processes described herein are capable of producing coating systems that may have a beneficial effect with regard to coke deposition. FIG. 2 is a bar graph plotting the extent of coke deposits formed at various sample locations within three tubes (Nos. 1, 2 and 3), two of which were treated using different coating processes to produce anti-coking coating systems on their interior surfaces. All three tubes were produced using the same AM process from CoCr alloy powders. The tubes were straight and had lengths of six inches (about 15 cm) and internal diameters of about 0.180 inch (about 46 mm). The interior surfaces of the tubes had surface roughnesses of about 250 to about 750 micro-inches (about 6.4 to about 19 micrometers) Ra. In FIG. 2, Tube 1 is designated as "As Built," that is, lacking any anti-coking coating system, whereas the interior surfaces of Tubes 2 and 3 were provided with anti-coking coating systems comprising an interior layer of tantala and an outermost layer of platinum. The coating system of Tube 2 was applied using an MO-CVD process and produced an interior layer having a thickness of about 1 micrometer and an outermost layer having a thickness of about 0.003 to about 0.10 micrometer. Deposition of the interior layer was performed at a deposition temperature of about 700 to about 900° F. (about 370 to about 480° C.) and a deposition pressure of about 50 to about 150 torr using MO-CVD equipment. Deposition of the outermost layer was performed by suspending the tube in a platinum powder in acetone and heating to about 500 to about 600° F. (about 260 to about 315° C.) for an hour in an air furnace. The coating system of Tube 3 was applied using a solgel liquid deposition process to produce an interior layer and an outermost layer whose combined thicknesses ranged from about 0.216 to about 1.860 micrometers, and therefore encompassed the range of combined thicknesses for the interior and outermost layers of the MO-CVD coating system on Tube 2.

The tubes were subjected to fuel at a temperature of about 300 to about 800° F. (about 150 to about 425° C.) at a flow rate of about 7 to about 15 pph (about 3.2 to about 6.8 kg/hr) for a duration of about 160 hours, then inspected for coke deposits at seven different locations spaced about 0.5 inch (about 13 mm) apart along the interior surfaces of their lengths. The resulting coke deposits ranged in thickness from about 0.006 inch to about 0.0075 inch (about 150 to about 190 micrometers). From the results represented in FIG. 2, it can be seen that the manner of application significantly influenced the anti-coking effect of the resulting coating system. The coating system produced by the solgel process (Tube 3) did not exhibit an anti-coking effect equivalent to the coating system produced by the vapor deposition process (Tube 2) at any of the seven locations evaluated. Surprisingly, at most evaluated locations Tube 3 had greater coke deposition as compared to the uncoated specimen (Tube 1). Though not wishing to be held to any particular theories, the results of the investigation were concluded to be unexpected in that a thicker, substantially nonconformal and therefore smoother coating system deposited by the solgel process (Tube 3) did not perform as well as a thinner, conformal and therefore rougher coating system deposited by the vapor deposition process (Tube 2).

While the invention has been described in terms of specific embodiments, it is apparent that other forms could be adopted by one skilled in the art. For example, the physical configuration of a fluid passage could differ from that shown or described, and materials and processes other than those noted could be used. Finally, while the appended claims recite certain aspects believed to be associated with embodiments of the invention, as indicated by the investigations discussed above, they do not necessarily serve as limitations to the scope of the application.

What is claimed is:

1. A method for producing a component having an internal passage with an interior surface thereof configured and adapted to contact a hydrocarbon fluid, the method comprising:
    producing the component and the internal passage thereof and the interior surface thereof using an additive manufacturing process; and
    performing a vapor deposition process that comprises flowing a first precursor through the internal passage to deposit a conformal interior layer directly on the interior surface and flowing a second precursor through the internal passage so as to deposit a conformal outermost layer overlying the interior layer, the interior layer and the outermost layer defining a conformal anti-coking coating system on the interior surface and the outermost layer defining an outermost surface of the anti-coking coating system;
    wherein the coating system is on at least a portion of the interior surface, the interior surface having a surface roughness of up to 30 micrometers Ra produced by the additive manufacturing process, and the outermost surface of the conformal anti-coking coating system defined by the outermost layer having a surface roughness of 6.4 to 19 micrometers Ra.

2. The method according to claim 1, wherein the internal passage has a nonlinear shape.

3. The method according to claim 1, wherein the internal passage comprises at least one passage section with a geometry that is at least one of sharp, multi-turn, helical, and annular bends, curves, loops, and spirals.

4. The method according to claim 1, wherein the interior layer comprises a composition, the composition consisting of silica, alumina, tantala, hafnia, yttria, or chemical combinations of silica with boron and/or phosphorous and/or alumina.

5. The method according to claim 1, wherein the outermost layer comprises a composition, the composition consisting of platinum.

6. The method according to claim 1, wherein the component is a fuel nozzle and the hydrocarbon fluid is a fuel, the method further comprising flowing the fuel through the internal passage.

7. The method according to claim 1, wherein the component is a hydraulic system component and the hydrocarbon fluid is an oil, the method further comprising flowing the oil through the internal passage.

8. The method according to claim 1, wherein the component and the internal passage and the interior surface thereof are formed of an alloy chosen from the group consisting of stainless steels, corrosion-resistant alloys of nickel and chromium, and high-strength nickel-base alloys.

9. A component produced by an additive manufacturing process to have an internal passage with an interior surface thereof configured and adapted to contact a hydrocarbon fluid, the component comprising:
    a conformal interior layer directly on the interior surface; and
    a conformal outermost layer overlying the interior layer, the interior layer and the outermost layer defining a conformal anti-coking coating system on the interior surface and the outermost layer defining an outermost surface of the anti-coking coating system;
    wherein the coating system is on at least a portion of the interior surface, the interior surface having a surface roughness of up to 30 micrometers Ra produced by the additive manufacturing process, and the outermost surface of the anti-coking coating system defined by the conformal outermost layer having a surface roughness of 6.4 to 19 micrometers Ra.

10. The component according to claim 9, wherein the internal passage has a nonlinear shape.

11. The component according to claim 9, wherein the internal passage comprises at least one passage section with a geometry that is at least one of sharp, multi-turn, helical, and annular bends, curves, loops, and spirals.

12. The component according to claim 9, wherein the interior layer comprises a composition, the composition consisting of silica, alumina, tantala, hafnia, yttria, or chemical combinations of silica with boron and/or phosphorous and/or alumina.

13. The component according to claim 9, wherein the outermost layer comprises a composition, the composition consisting of platinum.

14. The component according to claim 9, wherein the component is a fuel nozzle, the hydrocarbon fluid is a fuel, and the fuel is within the internal passage.

15. The component according to claim 9, wherein the component is a hydraulic system component, the hydrocarbon fluid is an oil, and the oil is within the internal passage.

16. The component according to claim 9, wherein the component and the internal passage and the interior surface thereof are formed of an alloy chosen from the group consisting of stainless steels, corrosion-resistant alloys of nickel and chromium, and high-strength nickel-base alloys.

\* \* \* \* \*